United States Patent

[11] 3,568,179

[72] Inventor John O. Lampkin, Jr.
Roanoke, Va.

[21] Appl. No. 669,179
[22] Filed Sept. 20, 1967
[45] Patented Mar. 2, 1971
[73] Assignee General Electric Company

[54] ANALOG TO DIGITAL CONVERTER
3 Claims, 12 Drawing Figs.

[52] U.S. Cl. 340/347
[51] Int. Cl. H03k 13/02
[50] Field of Search 340/347

[56] References Cited

UNITED STATES PATENTS

| | | | |
|---|---|---|---|
| 2,845,597 | 7/1958 | Perkins | 340/347 |
| 2,974,315 | 3/1961 | Lebel et al. | 340/347 |
| 2,989,741 | 6/1961 | Gordon et al. | 340/347 |
| 3,142,834 | 7/1964 | Falk et al. | 340/347 |
| 3,247,507 | 4/1966 | Moses | 340/347 |

*Primary Examiner*—Maynard R. Wilbur
*Assistant Examiner*—Charles D. Miller
*Attorneys*—John B. Sponsler, Gerald R. Woods, Lawrence G. Norris, Frank L. Neuhauser, Oscar B. Waddell, Melvin M. Goldenberg and Arnold E. Renner ABSTRACT: A continuously tracking analog to digital converter including a switching comparison amplifier, a pulse source, a reversible binary counter, and a gating circuit which allows pulses to be applied to the counter only under certain conditions of current imbalance at the amplifier. A negative analog signal is balanced at the amplifier by a positive D to A converter current and by a deadband current, the polarity of which is changed by the pulse source. The D to A current magnitude is a function of the counter contents and of the supply voltage for the D to A converter. The deadband current is a function of the supply voltage and of the state of a bistable multivibrator connected to the pulse source. When only slight current imbalance exists at the amplifier, the amplifier is continuously switched by the changing deadband current, a condition which inhibits the application of pulses to the counter.

INVENTOR
JOHN O. LAMPKIN, JR.

BY [signature]

HIS ATTORNEY

ANALOG TO DIGITAL CONVERTER

BACKGROUND OF THE INVENTION

The present invention relates to analogue to digital converters and more particularly to a continuously tracking analogue to digital converter using a switching comparison amplifier which can perform multiplication functions without numerical deadband width changes and can prevent counter fluctuations due to electrical noise or minor analogue input variations.

The use of digital techniques for process control purposes requires that certain analogue signals generated by process-monitoring analogue sensors be continuously converted to digital form. It is essential that the conversion of analogue information to digital information be both rapid and accurate. Prior art continuously tracking analogue to digital converters have used gain controlled linear amplifiers that change the states of level detecting trigger circuits when one count or so of error is sensed. Changes in the analogue input to such an analogue to digital converter cause changes in the contents of a digital counter at the output of the converter. The digital information contained in the counter is then utilized by digital equipment. A continuously tracking analogue to digital converter normally includes a digital to analogue converter for balancing the analogue input and a deadband which prevents fluctuations in the counter contents when the analogue input changes slightly or remains constant. Without such a deadband, any imbalance at the input to the analogue to digital converter causes the counter contents to fluctuate thereby producing a continually-varying digital output. If the analogue to digital converter includes a digital counter having N bits, there are only $2^{n-1}$ input voltage levels at which the digital to analogue converter can completely balance an analogue input. This is because the output of the digital to analogue converter can change only by discrete increments represented by incremental changes in the count in the N bit digital counter. Thus, most input voltages would cause a continually varying digital output in the absence of a deadband. Even though the variation might be only one count, it may cause every bit in the digital counter to change states if the analogue voltage is near $Va/2^{n-1}$ where $Va$ is the voltage that is converted to $2^{n-1}$ counts in the converter. A one count comparison amplifier deadband prevents such counter fluctuations. Of course, it may be desirable to increase the deadband width to prevent counter fluctuations due to input electrical noise.

In an analogue to digital converter using a linear amplifier and trigger, the numerical deadband width varies if the voltage used as a power supply for the analogue to digital converter varies. In certain applications, this voltage variation may represent a process variable. To offset this deadband variation with voltage variation, analogue to digital converters could be designed which exhibit varying gains at varying supply voltages. However, relatively costly and complex gain changing circuits would have to be utilized. Also, where linear amplifiers are used in analogue to digital converters with trigger circuits, the speed of circuit operation is limited by the characteristics of the trigger circuits and the closed loop response of the amplifier. Also, the magnitude of any hysteresis effects in the trigger circuits may cause error.

It is an object of the present invention to eliminate the requirements that gain changing circuitry be included to compensate for deadband width variations due to voltage variation. It is also an object of the invention to obviate the need for a linear amplifier and trigger circuits in an analogue to digital converter.

SUMMARY OF THE INVENTION

The present invention fulfills these objects by means of an analogue to digital converter which includes a comparison amplifier connected to a reversible binary counter by a pulse producing and gating circuit. The comparison amplifier has first and second output states and an input to which an analogue signal is applied. The analogue signal applied to the converter is balanced by balancing current from a source connected to a comparison amplifier. The magnitude of this balancing current depends on the count existing in the counter. The balancing current source switches the amplifier between its output states when the current imbalance at the input to the amplifier is less than a predetermined amount. The pulse producing and gating circuits gate pulses to the counter only if the output state of the comparison amplifier is not switched by the balancing current source within a predetermined time interval.

DESCRIPTION OF THE DRAWINGS

While the specification concludes with claims particularly pointing out and distinctly claiming that which is regarded as the present invention, the details of the invention along with its further objects and advantages may be more readily ascertained from the following detailed description when read in conjunction with the accompanying drawings in which:

DETAILED DESCRIPTION

Figure 1:
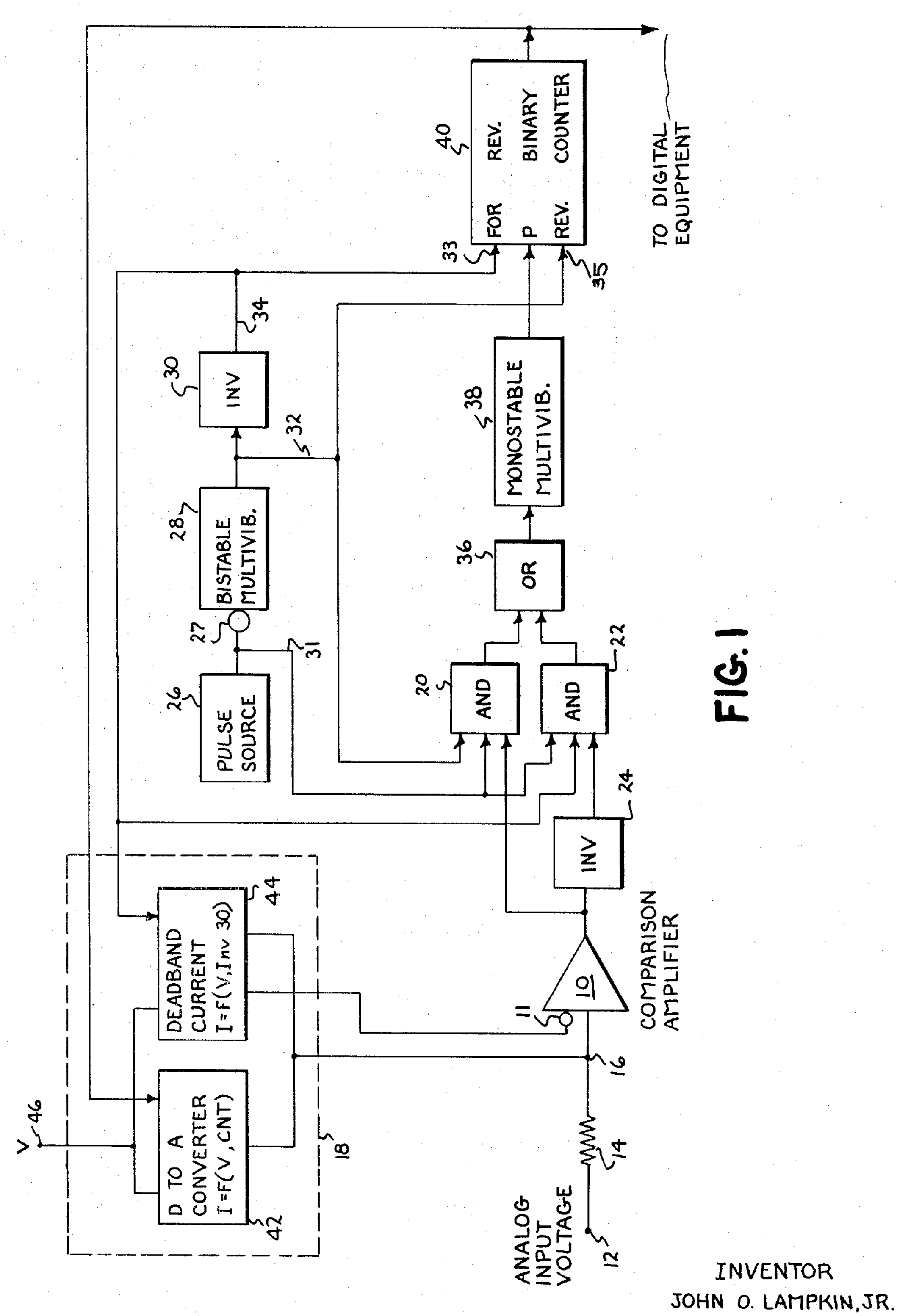
FIG. 1 is a block diagram showing the organization of an analogue to digital converter constructed in accordance with the present invention.

In FIG. 1 the comparison amplifier 10 accepts an input signal at a terminal 12 from a process-monitoring analogue sensor (not shown). The sensor output (voltage), converted to an analogue current by a resistor 14, is applied to a switching comparison amplifier 10 along with a balancing current of the opposite polarity from a balancing current source 18. Assuming for purposes of illustration that the analogue current is always negative while the balancing current is always positive, the comparison amplifier 10 produces a binary ONE signal (normally +5 volts) if the sum of the currents at its input is positive. However, if the sum of the currents is negative, the comparison amplifier 10 produces a binary ZERO signal (usually zero volts). The output of the comparison amplifier 10 is connected directly to a first AND gate 20 and indirectly to a second AND gate 22 through an inverter 24. The AND gates 20 and 22 are part of a pulse providing and gating circuit which includes a clock pulse source 26, a pulse dividing bistable multivibrator 28, and an inverter 30 serially connected to the bistable multivibrator 28. A second input to the AND gate 22 is provided by a bifurcated lead 34 from the inverter 30. The second branch of lead 34 is connected to a Forward count terminal 33 for a reversible binary counter 40. A second input to the AND gate 20 is provided by another bifurcated lead 32 from the bistable multivibrator 28. The second branch of lead 32 is connected to a Reverse count terminal 35 for the counter 40. The output of the AND gates 20 and 22 are combined in a single OR gate 36 at the input to a monostable multivibrator 38. The pulse source 26 is connected to bistable multivibrator 28 through a lead 31 and an inverter 27. Lead 31 also connects pulse source 26 to both AND gates 20 and 22.

Monostable multivibrator 38 provides pulses to the counter 40 which counts up or forward for each pulse delivered at its pulse input terminal P while a ONE signal exists at Forward count terminal 33 and down or in reverse for each pulse when a ONE signal exists at Reverse count terminal 35. The output of the reversible binary counter 40 is a digital number which is utilized by digital equipment connected to the analogue to digital converter. The counter output also is connected to a digital to analogue converter 42 in the balancing current source 18. The magnitude of the current provided by the digital to analogue converter 42 is a function of the count contained in the counter 40 and of the voltage at terminal 46, the power supply terminal for the digital to analogue converter 42. Balancing current source 18 also contains a source of deadband current 44 controlled by signals on the bifurcated lead 34. Unlike digital to analogue converter 42 which produces a positive current, the source 44 of deadband current produces current having an alternating polarity. Each time the inverter 30 changes states, the polarity of the current produced by the source 44 changes. While the inverter 30 is producing a ONE signal, the source 44 produces a positive current, the magnitude of which is a function of the power supply voltage appearing at terminal 46. Conversely, while the inverter 30 produces a ZERO signal, the source 44 produces a negative current having a magnitude dependent upon the magnitude of the voltage at terminal 46.

Figure 2:
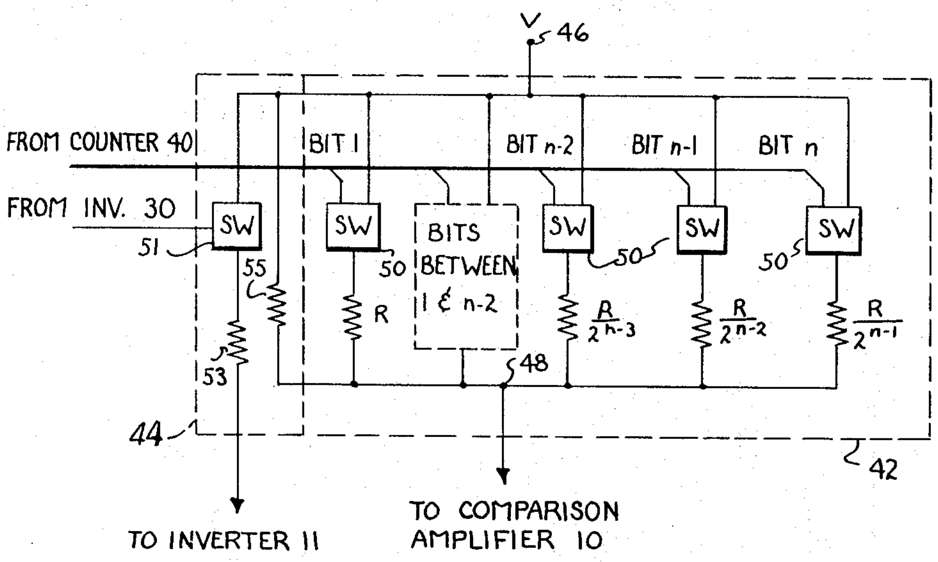
FIG. 2 is a schematic diagram of the digital to analogue converter and the deadband current source of the analogue to digital converter shown in FIG. 1.

The operation of the above-described circuit is described with reference to FIG. 5. However, the description of operation might be more readily comprehended if the details of the digital to analogue converter 42 and of the source 44 of deadband current are first explained. FIG. 2 is a schematic of both converter 42 and source 44. The digital to analogue converter 42 consists of a number of current producing branches equal to the number of bits in the reversible binary counter 40. Each current producing branch contains a resistor connected between a common junction 48 and a switching circuit 50 in the branch. Each switching circuit 50 connects the resistor in its branch to the power supply terminal 46 if the bit to which it is connected in reversible binary counter 40 is at one; i.e., in a set condition. If the bit to which a switching circuit is connected is at ZERO or in a reset condition, no current flows through the resistor. The magnitude of current produced by each branch in the converter 42 is directly proportional to the binary value of the bit to which that particular branch is connected in the reversible binary counter 40. The resistor in the branch connected to the first or least significant bit in the reversible binary counter 40 thus has a magnitude of R whereas the resistor in the branch connected to the most significant bit ($n$) in the reversible binary counter has a magnitude of $R/2^{n-1}$.

To illustrate, in a 4-bit binary counter the resistor contained in the branch connected to the bit 4 of the counter is $R/2^3$ or eight times smaller than the resistor contained in the branch connected to the bit 1 of the 4-bit binary counter. Similarly, the resistor connected to the bit 3 of the binary counter is $R/2^2$ or four times smaller than the resistor in the bit 1 branch. Consequently, the currents produced when the voltage at the power supply terminal 46 is applied across the resistors in the bit 4 and bit 3 branches is eight and four times greater, respectively, than the current produced when the voltage is applied across the bit 1 branch. When the currents from the various branches are summed, the current at junction 48 is an analogue representation of the contents of the reversible binary counter 40.

The source 44 of deadband current is somewhat similar to the individual branches in the digital to analogue converter 42. That is, source 44 includes a resistor 53 in series with a switching circuit 51. Unlike the switching circuits 50 in the digital to analogue converter 42, the switching circuit 51 is controlled by a direct connection to the bifurcated lead 34 from the inverter 30. The source 44 of deadband current is dissimilar to the individual branches in the converter 42 in two other respects. The source 44 includes a second resistor 55 connected directly between the power supply terminal 46 and the common junction 48. Also, the resistor 53 in the source 44 is not connected to the common junction 48. Instead, resistor 53 is connected to a second input to the comparison amplifier 10 through an inverter 11 so as to provide an input that is negative or in subtractive relation to the input through resistor 55. Each time the inverter 30 changes states, the switching circuit 51 is energized to change the polarity of the deadband current. The magnitude of resistors 53 and 55 in the source 44 determines the width of the deadband. In a preferred embodiment, the deadband current is alternately a positive half count and a negative half count for a one count total numerical deadband width.

Figure 3:
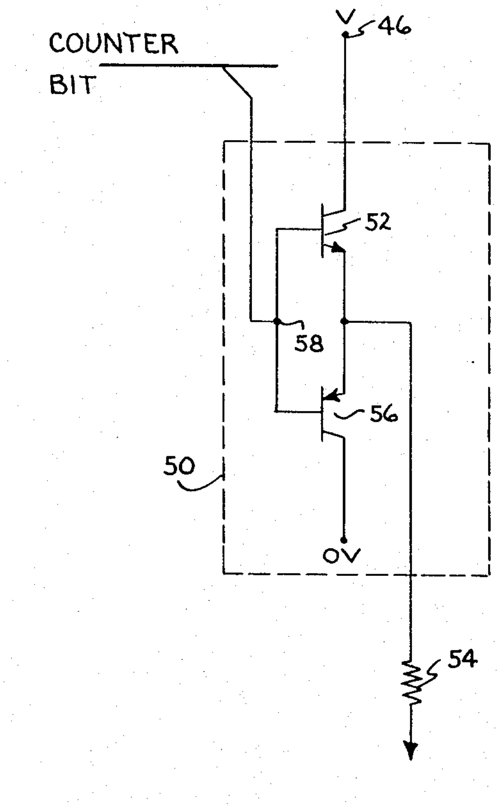
FIG. 3 is a schematic diagram of the switching circuit shown in block diagram form in FIG. 2 in the digital to analogue converter.
Figure 4:
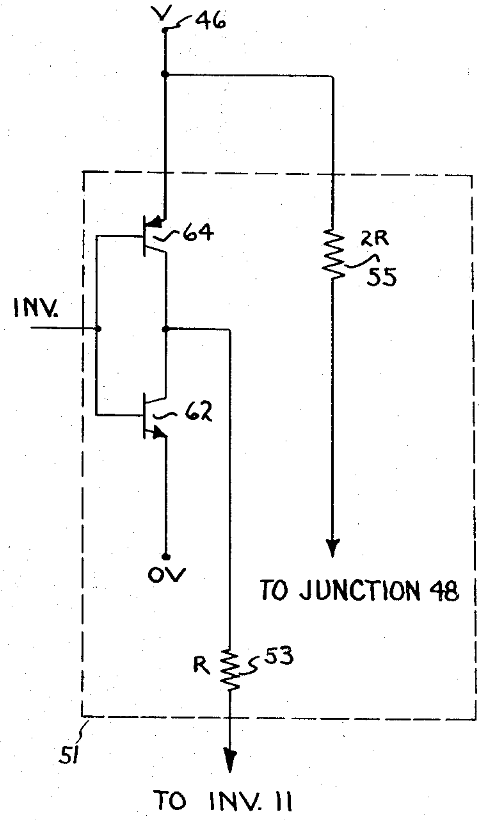
FIG. 4 is a schematic diagram of the switching circuit used for the deadband current source shown schematically in FIG. 2 and in block diagram form in FIG. 1.

An example of one type of switching circuit which may be used in each parallel branch in the digital to analogue converter 42 is shown in FIG. 3. The collector terminal of a first transistor 52 is connected directly to the power supply terminal 46. The emitter of the transistor 52 is connected both to a resistor 54 leading to the common junction 48 and to the emitter of a second transistor 56 having its collector connected to a zero voltage source. Base terminals for each of the transistors 52 and 56 are connected at a junction 58 which is directly connected to the output of a bit in the reversible binary counter 40. Whenever a binary ONE signal exists at the output of the particular bit, this ONE signal at the common junction 58 biases the transistor 52 into conduction and the transistor 56 into nonconduction, thereby effectively connecting resistor 54 to power supply terminal 46. Conversely, if a binary ZERO signal appears at the common junction 58, the transistor 52 is biased into nonconduction whereas the transistor 56 is biased into conduction so that the source of zero voltage is effectively connected to the resistor 54.

The switching circuit 51 for the source 44 of deadband current resembles the switching circuits 50 although the transistors used in the two types of switching circuits are of opposite conductivity types. The emitter terminal of a first transistor 64 is connected directly to the power supply terminal 46 while the collector terminal of that transistor is connected to the collector of a transistor 62 and to the resistor 53. Resistor 53 has a magnitude of R in the preferred embodiment and produces a current equivalent to one full count in the digital counter 40. When transistor 64 is driven into conduction and transistor 62 into nonconduction by a ZERO signal at the output of inverter 30, a positive current equivalent to one full count is applied to the inverter 11 through resistor 53. By means of conventional comparison amplifier connecting techniques, this positive current acts subtractively or as a negative one full count current within the amplifier 10. By combing this negative one full count with the positive one-half count continuously provided through resistor 55, it may be seen that the total magnitude of the deadband current is a negative one-half count while the output of the inverter 30 is at a ZERO signal level. Conversely, when transistor 62 is driven into conduction and transistor 64 into nonconduction by a ONE signal from the inverter 30, no current is applied to the inverter 11. The deadband current is that provided through resistor 55 alone, the equivalent of a positive half count.

Figures 5, 5A, 5B, 5C, 5D, 5E, 5F, 5G:
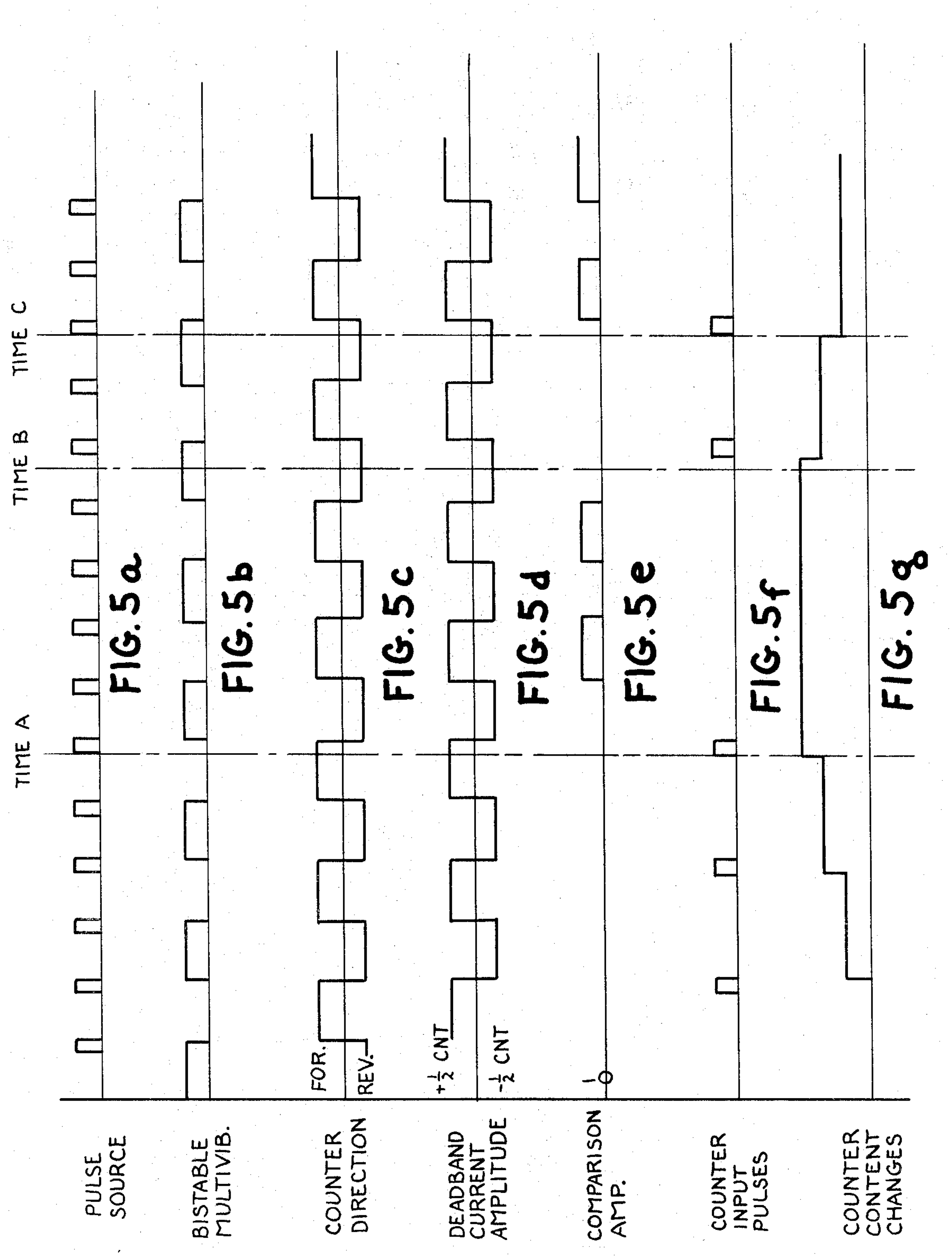
FIG. 5 is a waveform diagram used to explain the operation of the disclosed analogue to digital converter.

The operation of the analogue to digital converter described above is explained with reference to FIG. 5, which consists of FIGS. 5*a*—5*g* showing conditions at various points in the converter. FIG. 5*a* shows the output of pulse source 26 as a continuous train of uniformly spaced clock pulses. These clock pulses are "divided" by the bistable multivibrator 28 to produce the elongated pulses shown in FIG. 5*b*. Each time the bistable multivibrator 28 produces a ONE signal, this ONE signal is applied through the bifurcated lead 32 to terminal 35 for the reversible binary counter 40 to enable the counter to count in reverse only (FIG. 5*c*). The ONE signal appearing at the output of the bistable multivibrator 28 is inverted by the inverter 30 and applied through the bifurcated lead 34 as a ZERO signal to one input of the source 44 of deadband current. Conversely, a ZERO signal at the output of multivibrator 28 results in a ONE signal at source 44 with counter 40 being enabled to count forward only. As may be seen in FIG. 5*d*, a ONE signal causes source 44 to produce a positive current equivalent to one-half count in the counter 40. The positive half count current from the source 44 is applied to the comparison amplifier 10 along with the positive current from the digital to analogue converter 42, the output of which is determined by the voltage level at power supply terminal 46 and by the existing count in the counter 40. If the magnitude of the positive current from the balancing current source 18 (the sum of the positive currents from the converter 42 and the source 44) is less than the magnitude of the negative analogue current, the resulting negative current imbalance causes the comparison amplifier 10 to produce a ZERO signal (FIG. 5*e*) which, after being inverted by the inverter 24, becomes a ONE signal at one input to the AND gate 22. The amplifier's ZERO signal is also applied directly to the AND gate 20 to disable that AND gate. If the comparison amplifier 10 is producing a ZERO signal while the counter 40 is gated to count forward by a ONE signal on the bifurcated lead 34, AND gate 22 is partially enabled by ONE signals at two of its input terminals. At the next pulse from source 26, lead 31 goes to ONE to fully enable AND gate 22. A ONE signal is transmitted through OR gate 36 to the monostable multivibrator 38 where it is shaped before being applied in pulse form to terminal P for the counter 40. A pulse at terminal P (FIG. 5*f*) while the counter is gated to count forward increases the count in counter 40 (FIG. 5*g*) by one increment.

When the output of the bistable multivibrator 28 returns to ONE, the counter 40 is gated to count in reverse. The source 44 of deadband current produces a negative half count current in response to this ZERO signal at its input. If the balancing current (the sum of the positive and negative currents from the inverter 42 and the source 44 respectively) is smaller in magnitude than the negative analogue current, the comparison amplifier 10 continues to produce a ZERO signal. Both AND gates 20 and 22 are disabled. AND gate 22 is disabled by the ZERO signal appearing on the bifurcated lead 34 whereas AND gate 20 is disabled by the ZERO signal appearing at the output of the comparison amplifier 10. Under these conditions, no pulse is applied to the reversible binary counter 40. When the output of the bistable multivibrator 28 is driven to ZERO, the counter 40 is gated to count forward and the source 44 produces a positive half count current. If the current imbalance at the input to the comparison amplifier 10 remains negative, in spite of the previous one count increase in current from converter 42, AND gate 22 is enabled and passes a ONE signal from pulse source 26 which is shaped by the monostable multivibrator 38 before being applied to the counter 40. The counter 40 accumulates additional counts each time the counter is gated to count forward so long as the current imbalance at the amplifier input 16 remains negative. As the count in the counter 40 increases at each count, thereby reducing the magnitude of the negative current imbalance.

As the count in the counter 40 increased, the increasing combined current from the converter 42 and the source 44 eventually causes the current imbalance to change (time A) from negative to positive. When the output of the bistable multivibrator goes from ZERO to ONE to gate counter 40 to count in the reverse direction, the source 44 produces a negative half count current. If the positive current produced by the digital to analogue converter 42 (and the count in counter 40) has a magnitude within one-half count of the magnitude of the negative analogue current, the negative half count current from the source 44 reduces the magnitude of the balancing current (positive converter current plus negative deadband current) sufficiently to produce a negative current imbalance in the amplifier 10. This negative current imbalance causes the comparison amplifier output to become a ZERO signal which inhibits AND gate 20, but is applied to the AND gate 22 in the form of a ONE signal due to its inversion by the inverter 24. During the time the counter 40 is gated to count in a reverse direction, however, bifurcated lead 34 carries a ZERO signal while bifurcated lead 32 carries a ONE signal. Neither AND gate 20 nor AND gate 22 becomes full enabled and no pulses are applied to the counter 40.

When the output of the bistable multivibrator 28 again goes to ZERO to gate counter 40 to count in the forward direction, the combined positive current from the converter 42 and the source 44 has a greater magnitude than the negative analogue current if the difference between the analogue current and the current from converter 42 is less than one-half count. The positive current imbalance causes the amplifier 10 to produce a ONE signal which partially enables AND gate 20 and, after inversion by inverter 24, disables AND gate 22. With the counter gated to count in a forward direction, however, a ZERO signal appears at the second input to AND gate 20. Both AND gates 20 and 22 are inhibited and the reversible binary counter 40 remains at the same count level.

As long as the current from the digital to analogue converter 42 has a magnitude within one-half count of the magnitude of the negative analogue current, the changing of the alternate polarity deadband current in phase with the count direction gating signals causes the comparison amplifier 10 to switch between its first and second output states out of phase with the input ONE signals to AND gates 20 and 22. If the comparison amplifier 10 switches between it output states in less than a predetermined time or at each change in signal level from the bistable multivibrator 28, no pulses are applied to the reversible binary counter 40.

If the analogue current becomes more positive (time B) due to a change in the conditions sensed, the output of the comparison amplifier 10 goes to ONE and remains there until the counter 40 can count down to reduce the magnitude of current produced by the digital to analogue converter 42 to within one-half count of the negative analogue current. When the comparison amplifier 10 is producing a ONE signal while the counter 40 is gated to count in reverse, a pulse from source 26 completely enables AND gate 20. A ONE signal is then transmitted through OR gate 36 to the monostable multivibrator 38. The pulse generated by the monostable multivibrator 38 is applied to the counter 40 to cause the count contained therein to decrease by one increment. After the count in the counter 40 has fallen by the number of counts necessary to reduce the current produced by the converter 42 to within one-half count of the analogue current at time C, the alternate polarity half count current from the source 44 in combination with the positive current from the converter 42 causes a negative current imbalance in the comparison amplifier 10 when the counter 40 is gated to count in reverse but a positive current imbalance when the counter 40 is gated to count forward. The comparison amplifier 10 alternates between its first and second output states in the same manner as was described earlier to prevent the application of count-changing pulses to the reversible binary counter 40.

Because the current from both the digital to analogue converter 42 and the source 44 of deadband current is a function of the same supply voltage, changes in the supply voltage magnitude have no effect on the numerical width of the deadband. This characteristic is important in those situations where the supply voltage is not as constant as previously assumed, but instead represents a process variable. In some applications, it may be desired to have the analogue to digital converter perform a multiplication function which can be done simply by varying the supply voltage in inverse proportion to the multiplication factor desired. For illustrative purposes only, assume that with a supply voltage of 20 volts at terminal 46, a count of 6 must exist in the counter 40 in order for the current from the balancing current source 18 to balance a given analogue current. If the supply voltage is cut to 10 volts, it follows that the balancing current source 18 produces half as much balancing current since the magnitudes of the resistances in the source 18 remain unchanged. To double the balancing current to the value needed to match the given analogue input, the count in the counter 40 increased to a count of 12, double the former required count of 6 at the supply voltage of 20 volts. To be concise, at a given analogue input level, a change by a factor of $1/X$ in the level of the supply voltage results in a change by a factor of $X$ in the count required in the counter 40 to balance the given analogue input.

In commonly used digital to analogue converters a halving of the supply voltage results in a halving of the currents produced by all of the countercontrolled branches of the digital to analogue converter while the deadband current remains unchanged. More generally, the deadband numerical width in such converters varies by a factor of $X$ for a change by a factor of $1/X$ in the magnitude of the supply voltage. To reiterate, the numerical width of the deadband produced by source 44 cannot change since the deadband magnitude is a function of the magnitude of the supply voltage.

While there has been described at present what is thought to be a preferred embodiment of the present invention, variations and modifications therein will occur to those skilled in the art. Therefore, it is intended that the appended claims shall be construed as including all such variations and modifications as fall within the true spirit and scope of the invention.

I claim:

1. An analogue to digital converter for converting an analogue signal having a first polarity and provided by an analogue sensor to its digital equivalent, said converter including:

a. a reversible digital counter having direction-controlling input terminals and a count-changing pulse input terminal;

b. pulse providing means connected to the direction-controlling input terminals of said counter for alternately enabling said counter to count in a forward direction and in a reverse direction;

c. a source of balancing current of a second polarity including;

1. a digital to analogue converter connected to the output of said counter for producing an analogue current proportional to the count in said counter, and 2. a deadband current source connected to said pulse providing means for producing a second polarity current while said counter is enabled to count in a forward direction and a first polarity current while said counter is enabled to count in a reverse direction;

d. a comparison amplifier having inputs from the analogue sensor and said source of balancing current, said amplifier producing a first output signal when its total analogue input is of a first polarity and a second output signal when its total analogue input is of a second polarity; and e. a gating means having inputs from said comparison amplifier and said pulse providing means and an output to the count-changing pulse input terminal of said counter, said gating means providing count-changing pulses when said counter is enabled to count in a forward direction and said amplifier is producing the first output signal or when said counter is enabled to count in a reverse direction and said amplifier is producing the second output signal.

2. An analogue to digital converter as recited in claim 1 wherein the digital to analogue converter in said source of balancing current includes parallel branches connected between an input to said comparison amplifier and a source of voltage at the second polarity, each of said branches including a switching circuit connected to and controlled by a bit in said reversible counter and a serially connected resistor having a magnitude inversely proportional to the weight of the bit to which the switching circuit is connected.

3. An analogue to digital converter as recited in claim 2 wherein said deadband current source includes:

a. a first resistor connected between said source of voltage at the second polarity and an input to said comparison amplifier;

b. a second resistor connected at one end to an input to said comparison amplifier to apply current thereto in subtractive relation to the current supplied through said first resistor; and c. a switching circuit for selectively connecting said second resistor to said voltage source, said switching circuit being repetitively energized by said pulse-providing means in synchronism with changes in the direction in which said reversible counter is enabled to count.